(12) United States Patent
Takano et al.

(10) Patent No.: US 12,388,437 B2
(45) Date of Patent: Aug. 12, 2025

(54) RESET SEMICONDUCTOR INTEGRATED CIRCUIT AND ELECTRONIC CIRCUIT SYSTEM USING THE SAME

(71) Applicants: Yoichi Takano, Hadano (JP); Masaru Hirai, Hadano (JP)

(72) Inventors: Yoichi Takano, Hadano (JP); Masaru Hirai, Hadano (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 188 days.

(21) Appl. No.: 17/679,169

(22) Filed: Feb. 24, 2022

(65) Prior Publication Data

US 2022/0271747 A1    Aug. 25, 2022

(30) Foreign Application Priority Data

Feb. 24, 2021    (JP) ................. 2021-027547

(51) Int. Cl.
    *H03K 17/22*    (2006.01)
(52) U.S. Cl.
    CPC .................. *H03K 17/223* (2013.01)
(58) Field of Classification Search
    CPC .... H03K 17/223; H03K 17/167; H03K 17/22; G05F 1/468; G05F 1/565; G05F 1/575;
    (Continued)

(56) References Cited

U.S. PATENT DOCUMENTS 7,372,289 B2 * 5/2008 Hirooka ............... H03K 17/223
                                                        324/764.01
7,378,887 B2 * 5/2008 Morino ................. H03K 17/22
                                                        327/143
2008/0106309 A1 * 5/2008 Abe ...................... H03K 17/223
                                                        327/143

FOREIGN PATENT DOCUMENTS

JP       2006215454 A   *  8/2006
JP       2007-171133 A     7/2007
(Continued)

OTHER PUBLICATIONS

Notice of Reasons for Refusal for JP 2021-027547 dated Dec. 17, 2024.
(Continued)

*Primary Examiner* — Lincoln D Donovan
*Assistant Examiner* — James G Yeaman
(74) *Attorney, Agent, or Firm* — Shih IP Law Group, PLLC.

(57) ABSTRACT

Disclosed is a reset semiconductor integrated circuit that outputs a reset signal in response to a power supply voltage of a monitoring target becoming lower than a predetermined level, the reset semiconductor integrated circuit including: a voltage detection circuit; an output stage including a CMOS circuit that generates and outputs a signal according to a detection result of the voltage detection circuit; a monitored voltage input terminal to which the power supply voltage of the monitoring target is input; a reference potential terminal to which a voltage as a reference potential of a circuit is applied; an external voltage terminal which is connected to a power supply voltage terminal of the output stage to allow a power supply voltage as an operation voltage of the output stage to be applied from outside; and an output terminal to output the signal generated by the output stage.

6 Claims, 6 Drawing Sheets

(58) Field of Classification Search
CPC ........... H02M 3/158; H02M 7/53; G06F 1/24; G11C 5/147
See application file for complete search history.

(56) References Cited

FOREIGN PATENT DOCUMENTS

| | | | |
|---|---|---|---|
| JP | 2008-118381 A | | 5/2008 |
| JP | 2009044434 A | * | 2/2009 |
| JP | 2010-268258 A | | 11/2010 |
| JP | 2011-124657 A | | 6/2011 |

OTHER PUBLICATIONS

Notice of Reasons for Refusal for Japanese Patent Application No. 2021-027547, dated Apr. 30, 2025.

* cited by examiner

RESET SEMICONDUCTOR INTEGRATED CIRCUIT AND ELECTRONIC CIRCUIT SYSTEM USING THE SAME

CROSS-REFERENCE TO RELATED APPLICATION

This application is based upon and claims the benefit of priority from the prior Japanese Patent Application No. 2021-027547, filed on Feb. 24, 2021, the entire contents of which are incorporated herein by reference.

BACKGROUND

Technical Field

The present disclosure relates to a reset semiconductor integrated circuit (hereinafter, referred to as a reset IC) and an electronic circuit system using the same. The reset semiconductor integrated circuit generates and outputs a reset signal by monitoring a power supply voltage of an LSI (large-scale semiconductor integrated circuit) having a reset input terminal, such as a microcontroller, SoC (system on chip) with a built-in microcontroller, system LSI, or processor that performs image processing and various operations.

Background Art

When the power supply voltage drops during the operation of a microcontroller or an electronic circuit system equipped with a microcontroller (hereinafter simply referred to as a system), the system malfunctions or runs out of control. Thus, a reset circuit is required to monitor the power supply voltage and generate a reset signal to reset the microcontroller when the power supply voltage drops below a predetermined level. There have been provided reset ICs in each of which the circuit for generating such a reset signal is formed as a single semiconductor integrated circuit.

Conventional output circuit formats in reset ICs by CMOS process include open drain output and CMOS output using CMOS inverters.

In addition, some reset ICs are equipped with a delay circuit to release the reset after the power supply voltage rises sufficiently to prevent system malfunction immediately after power-on when the power supply voltage rises. Conventional inventions related to reset ICs include the inventions described in JP 2008-118381A and JP 2010-268258A, for example.

Among them, JP 2008-118381A discloses a reset device (IC) that uses CMOS output as the output circuit format. JP 2010-268258A discloses an invention of a reset IC with a built-in delay circuit that uses a counter circuit to change the delay time.

FIG. 6A shows the interface configuration of the reset signal in a voltage monitoring system using a reset IC with an output circuit format of open drain output, and FIG. 6B shows the interface configuration of the reset signal in a voltage monitoring system using a reset IC with an output circuit format of CMOS output.

Among them, for the open drain output of FIG. 6A, when a device such as a microcontroller is an LSI that operates with two power supplies: power supply voltage V1 for the CPU core and power supply voltage V2 for I/O, by connecting the pull-up resistor Rp to the power supply voltage V2 for I/O, the level of the reset signal RES output from the output terminal OUT of the reset IC can be input as a signal suitable for the interface (I/O) of the device such as the microcontroller.

However, in a configuration such as FIG. 6A, when power supply voltage V1 drops below a predetermined level and output terminal OUT is set to a low level, dark current flows through the pull-up resistor Rp between power supply voltage V2 and output terminal OUT which is at a low level. Thus, the battery-powered system has a problem of shortening the battery's usage time. Since the pull-up resistor Rp drives the input impedance of the later-stage device, it cannot be generally made high because a small drive current slows down the rise of the input signal.

On the other hand, in the case of CMOS output of FIG. 6B, dark current does not flow, but there is a problem that the devices as a voltage monitoring target are limited to those that operate with a single power supply.

SUMMARY

The present invention has been made in view of the above-described problems, and an object of the present invention is to provide a reset IC and an electronic circuit system using the same, wherein no dark current flows through the output stage when the output is at a low level, and wherein a reset signal can be input as a signal suitable for the interface circuit of an LSI or device without additionally providing a level shift circuit when the device to which the reset signal is to be supplied is the LSI or device that operates with multiple power supplies.

JP 2006-215454A describes a conventional invention regarding an IC that adopts CMOS output as the output circuit format and has a power supply voltage terminal for output circuit in order to apply a voltage different from the power supply voltage of the internal circuit as the power supply voltage of the output circuit. JP 2011-124657A describes a conventional invention regarding an IC that adopts CMOS output as the output circuit format and has a level shift circuit in the earlier stage of the output circuit to output a signal with an amplitude level different from the amplitude level of the internal signal. However, both of the inventions relate to driver circuits (driving circuits) for PDPs (plasma display panels), not to reset ICs that monitor the power supply voltages of microcontrollers or the like and output reset signals.

To achieve at least one of the abovementioned objects, according to an aspect of the present disclosure, there is provided a reset semiconductor integrated circuit that outputs a reset signal in response to a power supply voltage of a monitoring target becoming lower than a predetermined level, the reset semiconductor integrated circuit including: a voltage detection circuit; an output stage including a CMOS circuit that generates and outputs a signal according to a detection result of the voltage detection circuit; a monitored voltage input terminal to which the power supply voltage of the monitoring target is input; a reference potential terminal to which a voltage as a reference potential of a circuit is applied; an external voltage terminal which is connected to a power supply voltage terminal of the output stage to allow a power supply voltage as an operation voltage of the output stage to be applied from outside; and an output terminal to output the signal generated by the output stage.

BRIEF DESCRIPTION OF THE DRAWINGS

The accompanying drawings are not intended as a definition of the limits of the invention but illustrate embodiments of the invention, and together with the general description given above and the detailed description of the embodiments given below, serve to explain the principles of the invention, wherein.

DESCRIPTION OF EMBODIMENTS

Hereinafter, one or more embodiments of the present invention will be described with reference to the drawings. However, the scope of the present invention is not limited to the disclosed embodiments.

Figure 1:
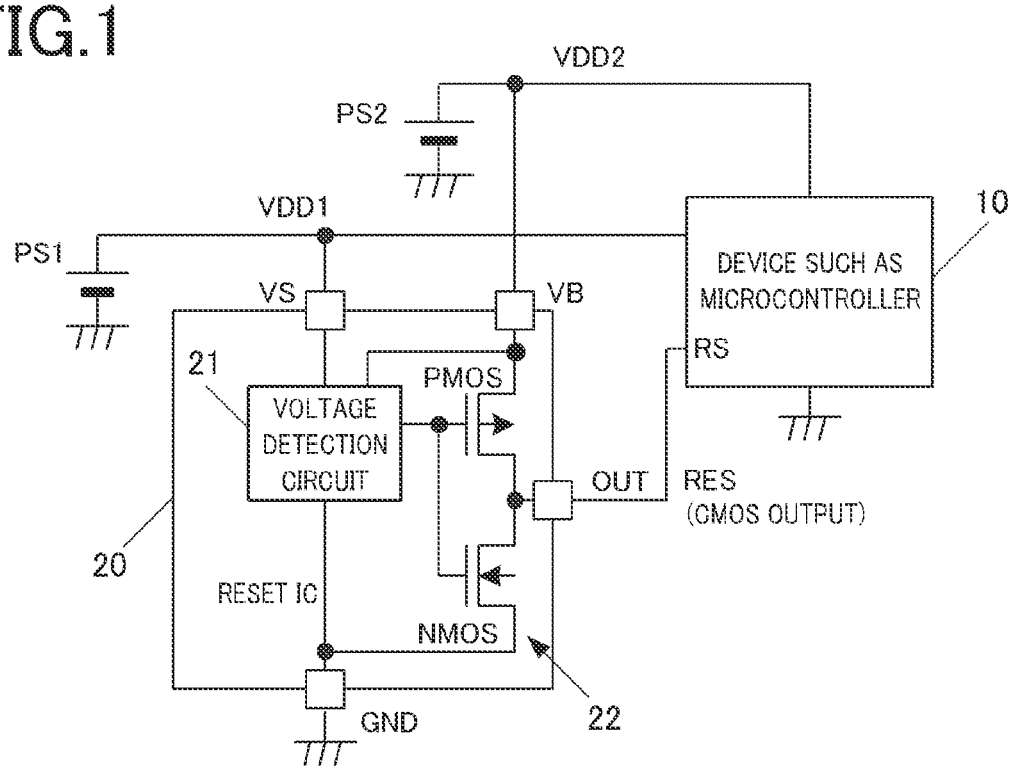
FIG. 1 is a circuit configuration diagram showing an embodiment of a reset IC to which the present invention is applied and an example of a suitable system using the same.

FIG. 1 shows an example of a reset IC to which the present invention is applied and a suitable system using the reset IC.

As shown in FIG. 1, the system includes: a device 10 such as a microcontroller that operates with the voltage VDD1 and VDD2 supplied from DC power supplies PS1 and PS2 such as batteries and DC-DC converters, as its power supply voltages; and a reset IC 20 that monitors VDD1 among the above voltages VDD1 and VDD2 supplied to the device 10, generates a reset signal, and outputs the reset signal to the CPU.

The device 10 has a CPU (microprocessor) core and I/O as an interface to receive input signals from outside and output signals to outside. The above voltage VDD1 is supplied to the device 10 as the power supply voltage for the CPU core. The above voltage VDD2 is supplied to the device 10 as a power supply voltage for I/O. In order to increase the operating speed of the device and achieve low power consumption, a low voltage such as 1.2V is selected for power supply voltage VDD1 which is the power supply voltage for the CPU core, while a voltage such as 3.3V is selected for power supply voltage VDD2, which is the power supply voltage for I/O. The I/O voltage is a common voltage for the interface between devices, and is set appropriately for each system.

The reset IC 20 is a device formed as a semiconductor integrated circuit on a semiconductor chip such as a single crystal silicon. The reset IC 20 in the embodiment incorporates a voltage detection circuit 21 and an output stage 22 consisting of a CMOS inverter that outputs the detection signal of the voltage detection circuit 21. The reset IC 20 is provided with an external terminal VS to which the power supply voltage VDD1 of a monitoring target is input, and an external terminal OUT that is connected to the output node of the output stage 22 and outputs the detection signal of the voltage detection circuit 21 to the outside of the chip. Furthermore, while the conventional reset IC with an output stage 22 consisting of CMOS inverter is configured such that the output stage 22 operates with a voltage VDD1 input to an external terminal VS, the reset IC 20 of the present embodiment has an external terminal VB to which a voltage that serves as a power supply voltage for the output stage 22 is applied.

In the system of FIG. 1, wiring is made such that the detection signal of the reset IC 20 is input as the reset signal RES to the reset input terminal RS of the device 10 such as a microcontroller, and that the power supply voltage VDD2 to be supplied as the power supply voltage for I/O is applied to the external terminal VB of the reset IC 20. Thus, the reset signal is supplied to the device 10 as a signal with an amplitude level of 0V to VDD2.

In addition, the voltage detection circuit 21 in the reset IC 20 monitors the input voltage VDD1 of the external terminal VS, and operates to change the reset signal RES output from the external terminal OUT by the output stage 22 to a low level when VDD1 falls to or below a predetermined level (e.g., 1.0V in the case of VDD1=1.2V). Though the voltage detection circuit 21 detects that VDD1 has fallen to or below a predetermined level in this example, but the voltage detection circuit 21 may detect that VDD1 has risen to or above a predetermined level, as in the case of overvoltage protection, for example.

According to the reset IC 20 with the above configuration and the system using the reset IC 20, when the monitored power supply voltage VDD1 falls to or below a predetermined level, the reset signal RES output from the reset IC 20 is changed to a low level. By this reset signal RES being input to the reset terminal RS of the device 10, the CPU core inside the device can immediately recognize that its power supply voltage falls below the predetermined voltage. Therefore, when a reset signal RES at a low level is input, the system can be shut down, for example, to prevent system runaway or malfunction due to the voltage decrease.

Moreover, since the above reset IC 20 has an external terminal VB, it is possible to output a reset signal level-shifted to an amplitude suitable for the device in the later stage from the rest IC 20 without installing a level-shift circuit for the device operating with two or more power supplies. Though the level is shifted toward a larger amplitude in this example, the level may also be shifted toward a smaller amplitude.

In addition, since the reset IC 20 uses a CMOS inverter for the output stage 22, when the reset signal output from the external terminal OUT is changed to a low level, the N-channel MOS transistor (N-MOS) that makes up the CMOS inverter is turned on and the P-channel MOS transistor (P-MOS) is turned off, so that no through-current flows. Thus, no dark current flows as in the open drain output stage. In addition, since P-MOS drives the impedance of the reset input terminal of the later device, there is no slowdown in the rise speed of the reset signal when it rises.

Furthermore, since no dark current flows through the output stage 22 of the reset IC 20, the battery usage time can be extended in mobile devices and in-vehicle electronic systems powered by batteries. In addition, since pull-up resistors are not required, the system has the advantage of reducing the number of elements that make up the system, thereby reducing costs and saving space in the system.

Figure 2A:
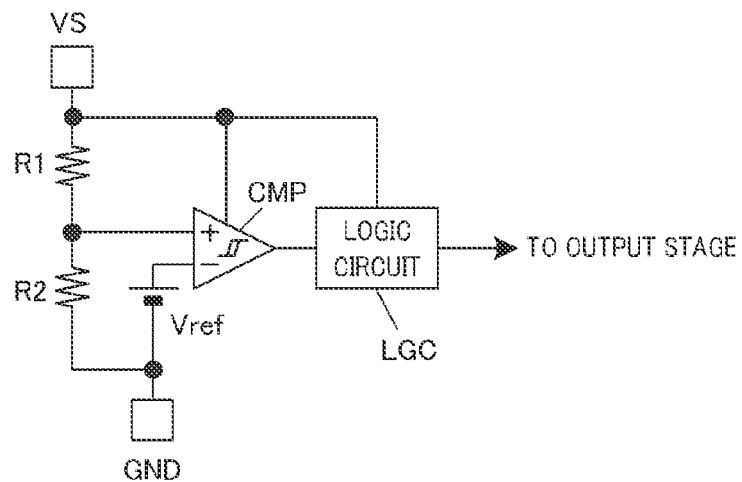
FIGS. 2A and 2B are circuit configuration diagrams each showing a specific example of a voltage detection circuit in the reset IC of the embodiment.
Figure 2B:
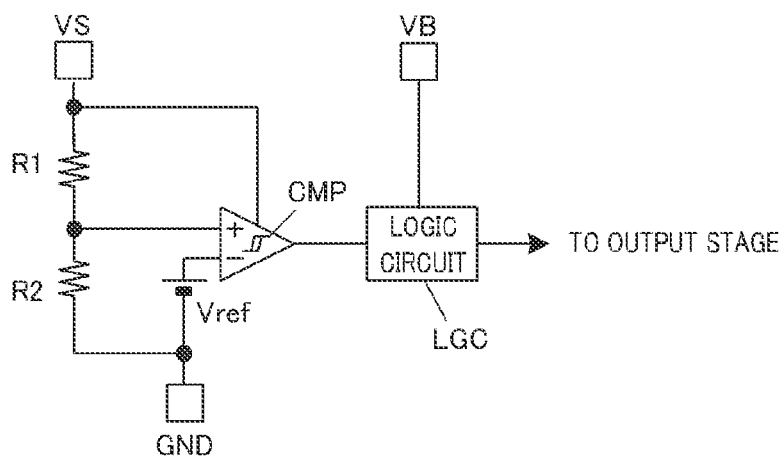

FIGS. 2A and 2B show specific examples of the voltage detection circuit 21 in the reset IC 20 of the above embodiment.

FIG. 2A shows the general configuration of the voltage detection circuit 21 in the reset IC 20, including a voltage dividing circuit, a reference voltage circuit, a comparator (voltage comparison circuit) CMP, and a logic circuit LGC. The voltage dividing circuit consists of resistors R1 and R2 connected in series between the external terminal VS to which the input source voltage VDD1 is applied and the external terminal GND to which the ground potential is applied. The reference voltage circuit generates a reference voltage Vref. The comparator (voltage comparison circuit) CMP compares the voltage divided by the voltage dividing circuit with the reference voltage Vref to determine whether the input voltage VDD1 has become lower than a predetermined level. The logic circuit LGC is provided in the later stage of the comparator CMP.

The comparator CMP consists of a Schmitt trigger circuit with the hysteresis characteristic to avoid fluttering of the output due to noise, and is wired to operate with the voltage VDD1 input to the external terminal VS. The reference voltage circuit that generates Vref can be composed of, for example, a Zener diode or a constant current source. Alternatively, the configuration of on/off operation using the VGS of a single transistor may be adopted.

The functions to be realized by the logic circuit LGC include, for example, functions of latch circuit, delay circuit, and level shift circuit. A single inverter can be used to construct the logic circuit LGC. In that case, the circuit including an inverter can be called a voltage comparison circuit.

In the voltage detection circuit 21 of FIG. 2A, the power supply voltage terminals of the comparator CMP and the logic circuit LGC are connected to the external terminal VS so that CMP and the logic circuit LGC operate with the voltage VDD1 input to the external terminal VS.

Alternatively, as shown in FIG. 2B, wiring may be made such that the comparator CMP operates with the voltage VDD1 and the logic circuit LGC operates with the voltage VDD2 applied to the external terminal VB. In this way, by making the applied VDD2 of the external voltage terminal VB a separate voltage from the monitored voltage VDD1, it is possible to eliminate level shift and low voltage operation limits.

Figure 6A:
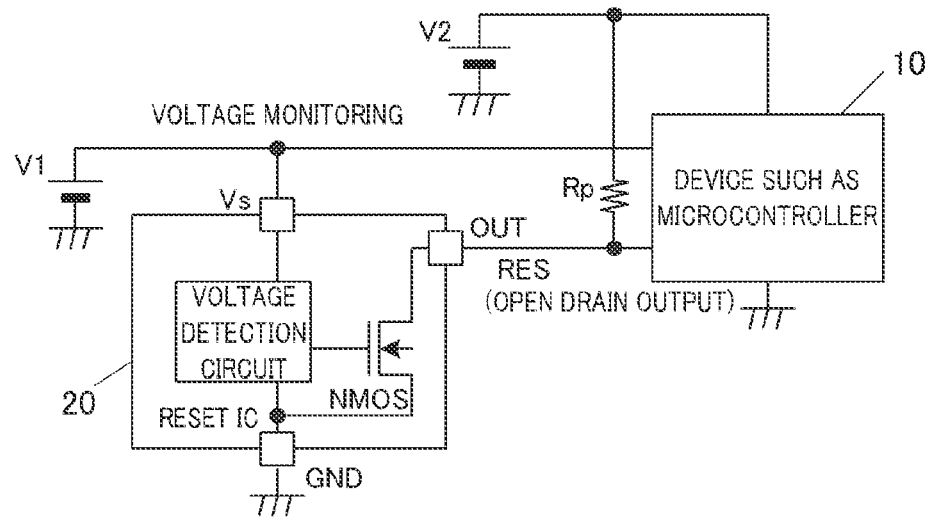
FIGS. 6A and 6B are circuit configuration diagrams each showing a configuration example of a conventional reset IC and an example of a system using the conventional reset IC.
Figure 6B:
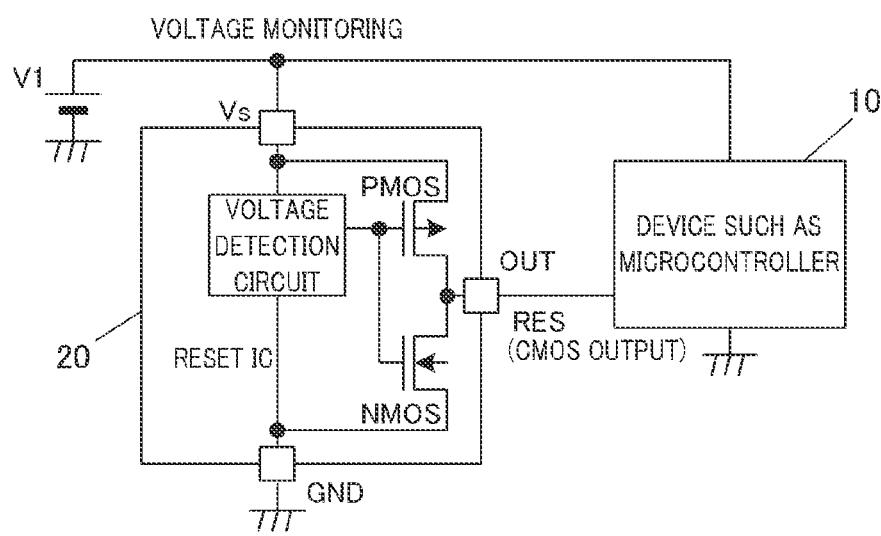

Furthermore, the reset IC 20 of the above embodiment using the voltage detection circuit 21 of any configuration shown in FIGS. 2A and 2B has one more external terminal than the 3-terminal reset ICs shown in FIGS. 6A and 6B. However, a small 4-terminal IC package can be used.

Figure 3:
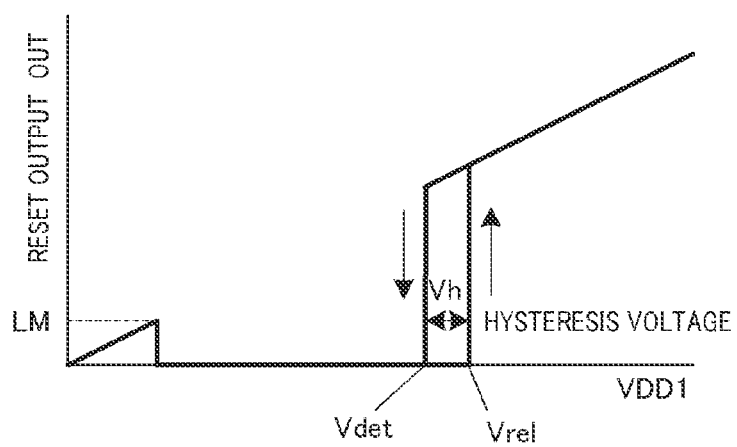
FIG. 3 is a graph showing the operating characteristics of the reset IC of the embodiment.

FIG. 3 shows the general operating characteristics of a reset IC (active low) using a comparator CMP with the hysteresis characteristic. In FIG. 3, Vdet is the voltage to detect when the reset signal is changed to a low level. When the input voltage VDD1 becomes equal to or lower than the detection voltage Vdet, the output reset signal becomes 0V. Vrel is the reset release voltage, Vh is the hysteresis voltage. When the input voltage VDD1 becomes the release voltage Vrel (Vdet+Vh) or greater, the output reset signal rises. LM is the operating limit of the IC and corresponds to the voltage between the gate and source of N-MOS.

Figure 4A:
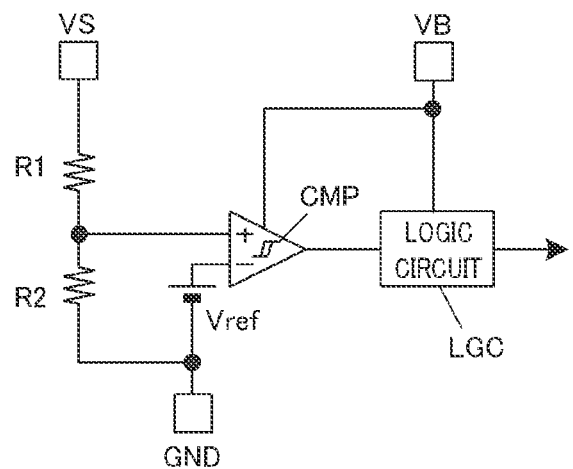
FIGS. 4A and 4B are circuit configuration diagrams respectively showing a modification example of the voltage detection circuit in the reset IC of the embodiment and an example of the system using the voltage detection circuit in the modification example.
Figure 4B:
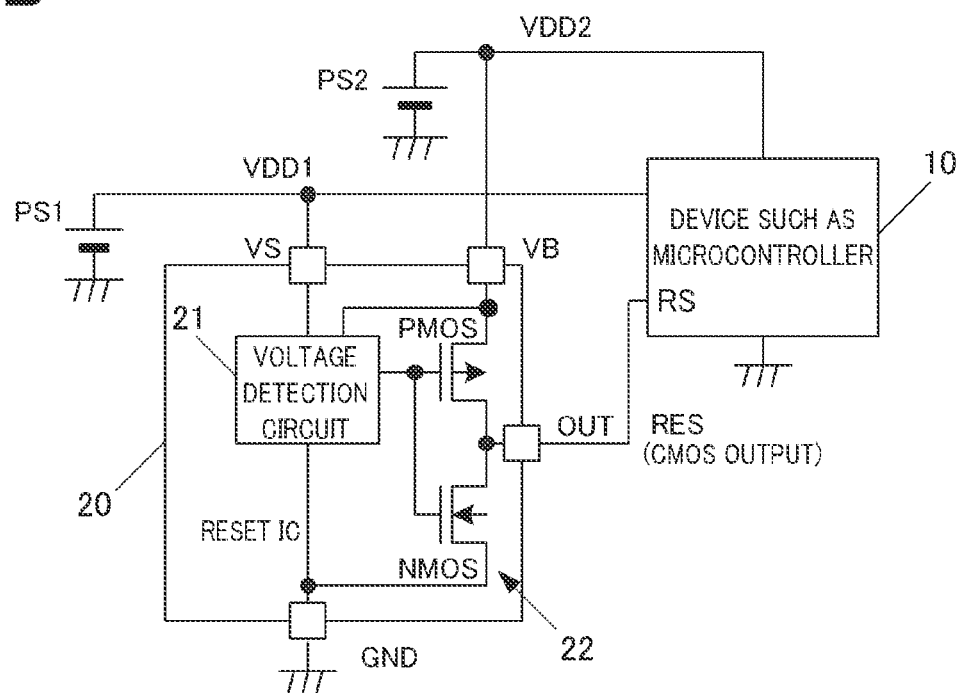

FIGS. 4A and 4B show a modification example of the reset IC 20 of the example in FIG. 2B. FIG. 4A shows an example of the configuration of the voltage detection circuit 21 inside the IC, and FIG. 4B shows an example of the system configuration using the reset IC 20 of this modification example.

This modification example is a sense-separated reset IC that separates the bias of the comparator CMP and the resistor voltage dividing circuit (R1, R2) constituting the voltage detection circuit 21. The power supply voltage terminals of the comparator CMP and the logic circuit LGC are connected to the external terminal VB, and the comparator CMP and the logic circuit LGC operate with the voltage VDD2 applied to the external terminal VB.

By configuring the reset IC 20 as described above, the gate-source voltage VGS of the P-MOS and N-MOS constituting the comparator CMP can be secured more sufficiently than that of FIG. 2B, and the operating limit LM of the IC shown in FIG. 3 is eliminated. In addition, even if the input voltage VDD1 of the external terminal VS drops, the voltage detection circuit 21 can operate stably. Therefore, the operation of generating the reset signal can be performed until the input voltage VDD1 of the external terminal VS becomes 0V. The voltage applied to the external terminal VB is not limited to VDD2, but can be any other voltage as long as it is stable.

Figure 5:
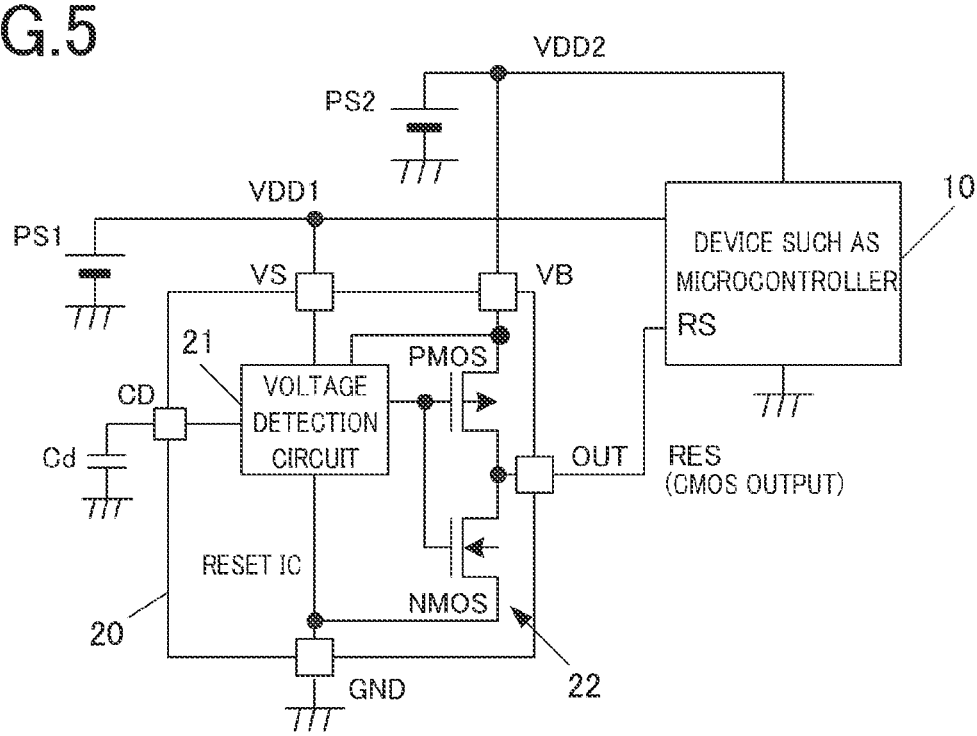
FIG. 5 is a circuit configuration diagram showing another example of the reset IC of the embodiment.

FIG. 5 shows another example of the reset IC 20 of the above embodiment.

The reset IC 20 in FIG. 5 additionally has a delay function. Specifically, the delay function generates a delay time for reset release at power-on, which is a common function of reset IC. As shown in FIG. 5, the reset IC 20 in this modification example has an external terminal CD to which an external capacitor Cd is connected, and is configured so that the delay time can be varied.

The delay circuit includes a comparator that detects a charging voltage and a resistor or a constant current source to charge the capacitor Cd for the logic circuit LGC. Since the above configuration of the delay circuit is well known, the illustration thereof is omitted. The delay circuit is not limited to a form that charges a capacitor, but can also use a timer circuit consisting of a counter that counts clock signals, as described in JP 2010-268258A. The delay function may add a delay when releasing the reset at power-on and/or when applying the reset.

Although one embodiment of the present invention has been described above, the present invention is not limited to the above embodiment, and various changes can be made based on the technical concept of the present invention. For example, in the embodiment, reset is applied by lowering the reset signal to a low level, and reset is released by raising the reset signal to a high level. However, the relationship between high and low levels can be inverse.

The above embodiment shows a device that operates with two power supplies as a device that receives the reset signal RES, but it can also be a device or system that operates with three or more power supplies.

Figure 7:
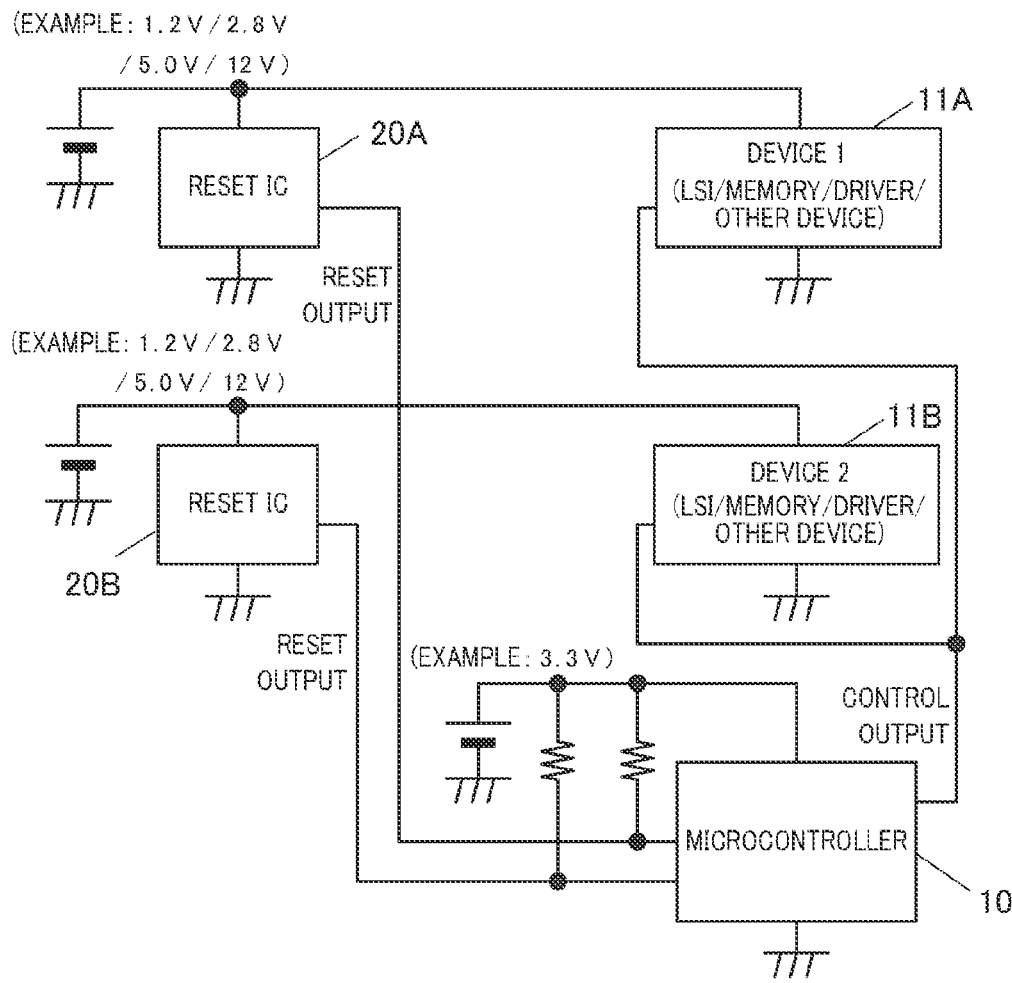
FIG. 7 is a circuit configuration diagram showing an example of a system with three power supplies that can use the reset IC of the present invention.

FIG. 7 shows an example of a system that operates with three power supplies. The system shown in FIG. 7 consists of a microcontroller 10 and non-microcontroller devices 11A and 11B controlled by the microcontroller, each of which operates at a different power supply voltage. The power supply voltages of the non-microcontroller devices 11A and 11B are monitored by the reset ICs 20A and 20B. The present invention can also be applied to the reset ICs 20A and 20B in the system of FIG. 7.

Furthermore, the device 10 that receives the reset signal RES may be a microcontroller, a system-on-chip (SoC) with a built-in microcontroller, a system LSI, or an LSI or an IC having a reset input terminal such as a processor that performs image processing or various operations. Systems using the reset IC are not limited to those consisting of a reset IC 20 and a single device 10 that receives the reset signal. The device 10 may also consist of multiple LSIs or ICs.

According to the above-described embodiment, a reset semiconductor integrated circuit outputs a reset signal in response to a power supply voltage of a monitoring target becoming lower than a predetermined level. The reset semiconductor integrated circuit includes: a voltage detection circuit; an output stage including a CMOS circuit that generates and outputs a signal according to a detection result of the voltage detection circuit; a monitored voltage input terminal to which the power supply voltage of the monitoring target is input; a reference potential terminal to which a voltage as a reference potential of a circuit is applied; an external voltage terminal which is connected to a power supply voltage terminal of the output stage to allow a power supply voltage as an operation voltage of the output stage to be applied from outside; and an output terminal to output the signal generated by the output stage.

With the reset semiconductor integrated circuit having the above configuration, since the output stage is a CMOS circuit, there is no dark current flowing in the output stage when the output is at a low level. In addition, since the output reset signal is a signal with an amplitude from the reference potential (GND) to the voltage applied to the external voltage terminal, the signal can be output as a signal with a level suitable for the interface of the device that receives the reset signal without additionally providing a level shift circuit in the later stage. Furthermore, since it is a four-terminal device, a small IC package can be used.

It is preferred that the voltage detection circuit includes: a voltage dividing circuit that is connected between the monitored voltage input terminal and the reference potential terminal, and divides the power supply voltage of the monitoring target; and a voltage comparison circuit that compares the voltage divided by the voltage dividing circuit with a predetermined reference voltage, and the voltage comparison circuit includes a hysteresis characteristic.

With this configuration, since the voltage comparison circuit has the hysteresis characteristic, it can be less susceptible to noise and other factors.

It is preferred that wiring is made such that the voltage comparison circuit operates with the power supply voltage applied to the external voltage terminal as an operation voltage.

With this configuration, the operating limits of the IC are eliminated, and the voltage comparison circuit can operate stably even when the voltage of the monitoring target drops.

It is preferred that a logic circuit having a predetermined function is connected in a later stage of the voltage comparison circuit, and an output signal of the logic circuit is input to the output stage, and wiring is made such that the logic circuit operates with the power supply voltage applied to the external voltage terminal as an operation voltage.

With this configuration, since the logic circuit in the later stage of the voltage comparison circuit (comparator) operates with the power supply voltage (VDD2) applied to the external voltage terminal (VB) as the operation voltage, it is possible to operate the output stage reliably and avoid the flow of through-current.

It is preferred that the logic circuit is a delay circuit including a capacitor, and an external terminal is provided to connect the capacitor as an external element.

With this configuration, a delay can be added to the release of reset when the power supply is activated and the change in reset signal when a reset occurs, and the delay time can be set arbitrarily by selecting the capacitance value of the external capacitor connected to the external terminal.

According to another aspect of the present disclosure, there is provided an electronic circuit system including: the reset semiconductor integrated circuit having the above configuration; and an IC or LSI that includes a reset input terminal, the IC or LSI being one or more ICs or LSIs. The IC or LSI operates with two or more power supply voltages, and the reset signal output from the reset semiconductor integrated circuit is input to the reset input terminal. Wiring is made such that a low power supply voltage among the two or more power supply voltages is input to the monitored voltage input terminal of the reset semiconductor integrated circuit, and a power supply voltage higher than the power supply voltage input to the monitored voltage input terminal among the two or more power supply voltages is applied to the external voltage terminal of the reset semiconductor integrated circuit.

With the electronic circuit system having the above configuration, pull-up resistors are not required, which contributes to cost reduction by reducing the number of elements and space saving of the system. In addition, since the reset signal input to the IC or LSI is a signal with an amplitude from the reference potential (GND) to the voltage applied to the external voltage terminal, the signal can be supplied as a signal with a level suitable for the interface of the LSI or IC without additionally providing a level shift circuit when the device to receive the reset signal is the LSI that operates with multiple power supplies or LSI or IC that constitutes the system operating with multiple power supplies.

It is preferred that a CPU core and an interface circuit of a signal are built in the IC or LSI, the CPU core operates with a first power supply voltage, and the interface circuit operates with a second power supply voltage higher than the first power supply voltage, and wiring is made such that the first power supply voltage is input to the monitored voltage input terminal of the reset semiconductor integrated circuit and the second power supply voltage is applied to the external voltage terminal of the reset semiconductor integrated circuit.

With this configuration, when the device that receives the reset signal is an LSI or IC including a CPU core and an interface circuit for signals that are built in the LSI or IC and operates with two power supplies, the signal can be input as a signal suitable for the interface circuit of the LSI or IC. In addition, even if the power supply voltage of a monitoring target is the voltage of a battery or other device and the voltage level drops, a reset signal can certainly be input to the interface circuit to reset the system, thus preventing the system from malfunctioning or running out of control due to a drop in power supply voltage.

According to the above-described embodiments of the present invention, it is possible to realize a reset IC and an electronic circuit system using the rest IC, in which there is no dark current flowing in the output stage when the output is at a low level, and the signal can be input as a signal suitable for the interface circuit of an LSI or IC without additionally providing a level shift circuit when the device to which the reset signal is supplied is the LSI that operates with multiple power supplies or the LSI or IC constituting a system that operates with multiple power supplies.

Although some embodiments of the present invention have been described and illustrated in detail, the disclosed embodiments are made for purposes of not limitation but illustration and example only. The scope of the present invention should be interpreted by terms of the appended claims.

What is claimed is:

1. An electronic circuit system, comprising:
a reset semiconductor integrated circuit that outputs a reset signal in response to a power supply voltage of a monitoring target becoming lower than a predetermined level; and
an IC or LSI that includes a reset input terminal, the IC or LSI being one or more ICs or LSIs,
wherein the IC or LSI operates with two or more power supply voltages, and the reset signal output from the reset semiconductor integrated circuit is input to the reset input terminal,
wherein the reset semiconductor integrated circuit comprises:
a voltage detection circuit;
an output stage including a CMOS circuit that generates and outputs a signal according to a detection result of the voltage detection circuit;
a monitored voltage input terminal to which the power supply voltage of the monitoring target is input;
a reference potential terminal to which a voltage as a reference potential of a circuit is applied;
an external voltage terminal which is connected to an internal power supply voltage terminal of the output stage to allow a power supply voltage different from the power supply voltage of the monitoring target as an operation voltage of the output stage to be applied from outside; and
an output terminal to output the signal generated by the output stage, wherein the voltage detection circuit includes:
a voltage dividing circuit that is connected between the monitored voltage input terminal and the reference potential terminal, and divides the power supply voltage of the monitoring target; and
a voltage comparison circuit that compares the voltage divided by the voltage dividing circuit with a predetermined reference voltage,
wherein wiring is made such that the voltage comparison circuit operates with the power supply voltage applied to the external voltage terminal as an operation voltage, and
wherein the two or more power supply voltages supplied to the IC or LSI are at least the power supply voltage of the monitoring target and the power supply voltage as the operation voltage of the output stage.

2. The electronic circuit system according to claim 1, wherein the voltage comparison circuit includes a hysteresis characteristic.

3. The electronic circuit system according to claim 1, wherein:
a logic circuit having a predetermined function is connected in a later stage of the voltage comparison circuit, and an output signal of the logic circuit is input to the output stage, and
wiring is made such that the logic circuit operates with the power supply voltage applied to the external voltage terminal as an operation voltage.

4. The electronic circuit system according to claim 3, wherein the logic circuit is a delay circuit including a capacitor, and an external terminal is provided to connect the capacitor as an external element.

5. The electronic circuit system according to claim 1, wherein
wiring is made such that as the power supply voltage to be the operation voltage of the output stage input to the external voltage terminal of the reset semiconductor integrated circuit, a power supply voltage higher than the power supply voltage of the monitoring target input to the monitored voltage input terminal is applied.

6. The electronic circuit system according to claim 5, wherein:
a CPU core and an interface circuit of a signal are built in the IC or LSI,
the CPU core operates with a first power supply voltage, and the interface circuit operates with a second power supply voltage higher than the first power supply voltage, and
wiring is made such that the first power supply voltage is input to the monitored voltage input terminal of the reset semiconductor integrated circuit and the second power supply voltage is applied to the external voltage terminal of the reset semiconductor integrated circuit.

* * * * *